United States Patent [19]
Johnson

[11] Patent Number: 5,694,132
[45] Date of Patent: Dec. 2, 1997

[54] VOLTAGE FEEDBACK LINEARIZER

[75] Inventor: Richard W. Johnson, Port Richey, Fla.

[73] Assignee: Alliant Defense Electronics Systems, Inc., Clearwater, Fla.

[21] Appl. No.: 796,832

[22] Filed: Nov. 12, 1985

[51] Int. Cl.[6] .................................................. G01S 13/00
[52] U.S. Cl. ........................... 342/200; 342/199; 342/128
[58] Field of Search ........................... 342/83, 122, 128, 342/199, 200; 331/4; 328/184

[56] References Cited

U.S. PATENT DOCUMENTS

| | | | |
|---|---|---|---|
| 3,872,406 | 3/1975 | Grafinger | 331/4 X |
| 4,160,958 | 7/1979 | Mims et al. | 331/4 X |
| 4,336,511 | 6/1982 | Stromswold et al. | 331/4 X |
| 4,539,565 | 9/1985 | Norsworthy | |
| 4,593,287 | 6/1986 | Nitardy | |
| 4,692,766 | 9/1987 | Rolfs | |
| 4,754,277 | 6/1988 | Voyce | 331/4 X |

*Primary Examiner*—Mark Hellner
*Attorney, Agent, or Firm*—Seymour Levine, ESQ.

[57] ABSTRACT

Apparatus for linearizing the sweep frequency output of an FMCW radar employing a voltage controlled oscillator includes means for comparing a series of reference voltages sequentially with the instantaeous oscillator drive voltge, accumulating the individual resultant error voltages throughout successive sweep cycles, sequentially converting the individual accumulated voltages to exponential form and feeding the exponential voltages back into the drive circuit for the VCO.

8 Claims, 5 Drawing Sheets

VOLTAGE FEEDBACK LINEARIZER

BACKGROUND OF THE INVENTION

1. Field of the Invention

The invention relates to frequency modulated continuous wave radar systems and more specifically to linearizers for assuring that the frequency of the output signal of such a system varies in a linear fashion.

2. Description of the Prior Art

Frequency modulated continuous wave (FMWC) radar systems require a periodic linear frequency sweep in order to achieve optimum range resolution.

Typically the sweep circuits in such systems employ a voltage controlled oscillator (VCO) whose frequency is regulated by means of a drive voltage which is used to bias the VCO itself or to actuate a varactor diode in a microwave cavity associated with the VCO. With either of these tuning methods, the output frequency is a non-linear function of the drive voltage. Therefore, to provide the desired linear frequency sweep, a nonlinear compensation circuit or linearizer must be used.

Prior art linearizers frequently use an open loop piecewise compensation circuit with as many as 15 adjustment potentiometers. The linearizer compensation characteristic is derived by a trial and error alignment procedure. Additionally, the voltage versus frequency characteristics of VCO devices varies with temperature necessitating regulation of the VCO temperature. Furthermore, since such linearizers are open loop circuits they have to be continuously readjusted to compensate for changing linearizer circuit characteristics.

Co-pending patent application Ser. No. 696,236 filed in the name of the present inventor and assigned to the present assignee concerns a frequency feedback linearizer which utilizes means to sample the output signal, delay this sample, and obtain a series of beat frequency indications arising between the original and delayed samples during each frequency sweep. The beat signals are used to create a series of correction voltages which distort the drive voltage output of the linearizer to compensate for any non-linearity in the radar system frequency sweep.

Such frequency feedback linearizers have proven to be useful devices, however, the required delay means may become to long or too bulky or demonstrate too much delayed signal attenuation for some applications, particularly where small frequency sweep extents are desired or the operating frequency of the delay means is too high. In such cases the use of frequency feedback is not practical.

The present invention eliminates the need for such delay means and therefore permits the use of a feedback linearizer in applications where frequency feedback is not practical.

SUMMARY OF THE INVENTION

A series of several predetermined reference voltages are sequentially compared to the instantaneous voltage levels of the VCO sweep drive voltage during each sweep cycle and the resulting error sequence voltages are applied to individual sample and hold circuits. The sampled error signals are stored in individual accumulators throughout successive sweep cycles so as to provide a set of feedback correction voltages which are used to modify the sweep drive voltage and restore a linear sweep frequency output.

DESCRIPTION OF THE PREFERRED EMBODIMENT

Typically, the frequency of the output signal produced by a VCO such as a GaAs Transferred Electron Device varies as a quasi logarithmic function of the oscillator control voltage. The linearizer of the present invention provides a sequence of qausi exponential voltages during each frequency sweep for counteracting the nonlinearity of such devices.

Figure 1:
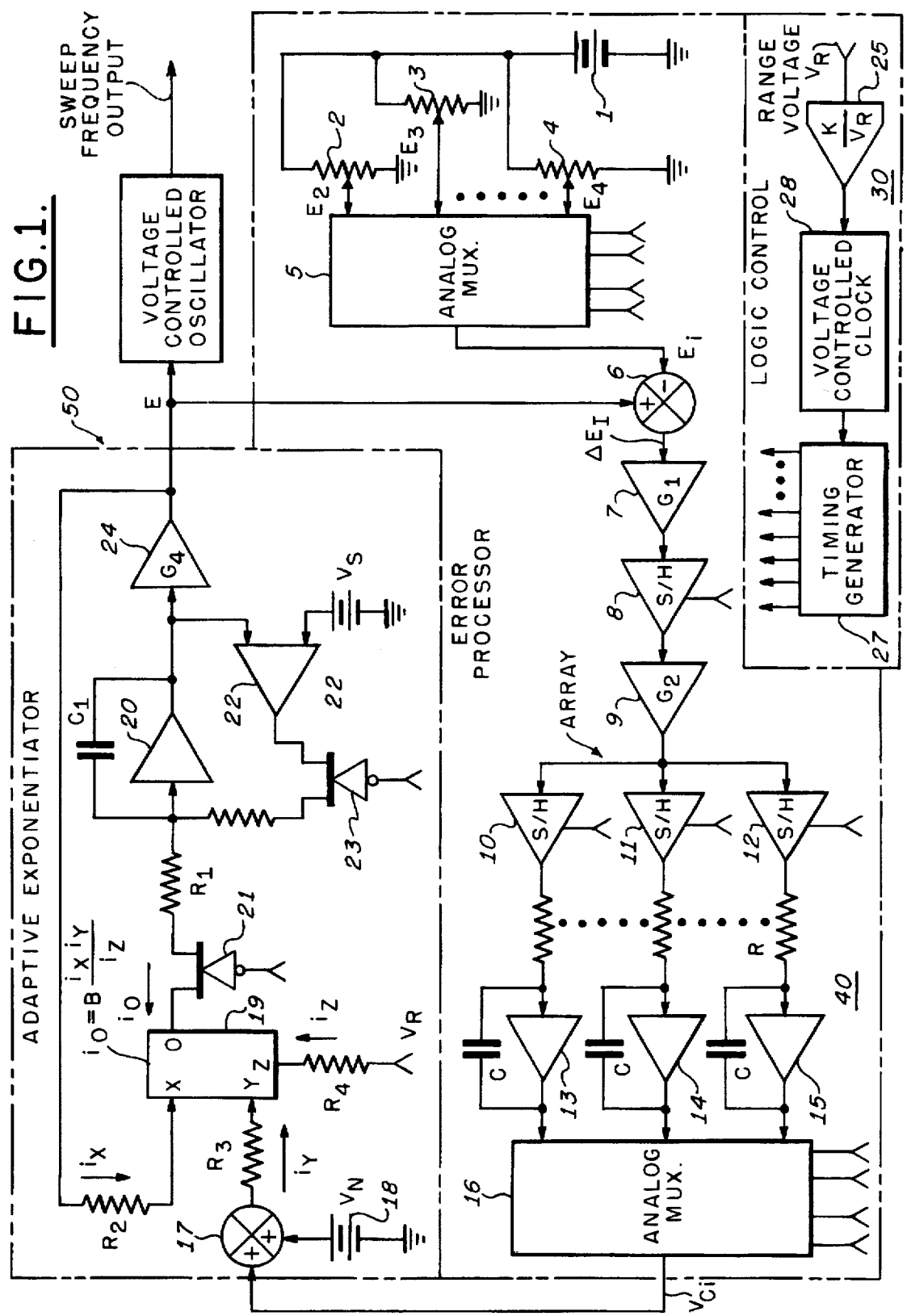
FIG. 1 is a block diagram illustrating a linearizer constructed in accordance with the principles of the invention.

As depicted in FIG. 1, the linearizer comprises three principal subassemblies: a logic control 30 for controlling the operation of the linearizer, an error processor 40 for sensing deviations from the desired operating parameters and an adaptive exponentiator 50 for providing corrections to counteract such deviations.

It will be recalled by those skilled in the art that in FMCW radar systems of the type being considered, a range voltage $V_R$ is generated which is proportional to the sweep period of the transmitted signal. As will be explained, the range voltage is used in the present invention to control the operation of the logic control subassembly.

The linearizer also utilizes a series of predetermined DC reference voltages in a manner to be explained. Typically, a set of six such voltages will be used although more or fewer reference voltages may be used if desired. As indicated in FIG. 1 these voltages may be generated by means of a standard circuit employing a DC voltage source 1 and a potentiometer for adjusting each reference voltage. Assume for purposes of explanation that six reference voltages $E_i$ where $E_i=E_1, E_2 \ldots E_6$ are to be utilized. In order to simplify the drawing, however, only three potentiometers, 2, 3, and 4 are indicated in FIG. 1.

The six reference voltages are applied simultaneously to a multiplexer 5 which acts in response to timing signals from the logic control to apply the reference signals sequentially to a subtractor 6 which also receives a sample of the sweep drive voltage E.

Figure 2:
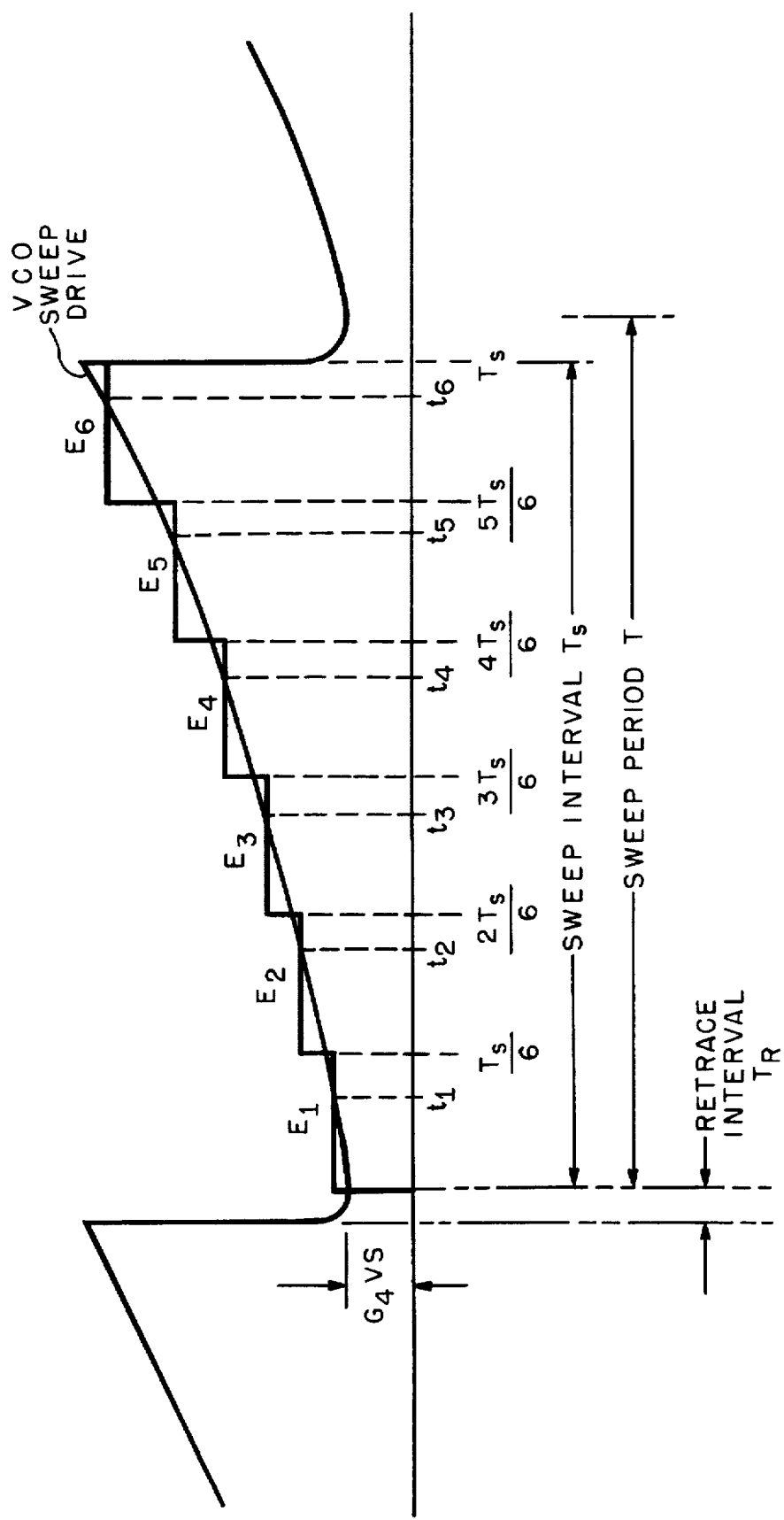
FIG. 2 is a graphical representation of voltages occurring during one sweep period.

FIG. 2 illustrates the relationship between these voltages. The reference voltages $E_1 \ldots E_6$ are supplied sequentially to the subtractor 6 in order of increasing magnitude. Preliminary adjustments of the potentiometers establish reference voltages which are equal to the sweep drive voltage E at specific time intervals $t_1, t_2, \ldots t_6$, as indicated in FIG. 2, for the case where the VCO is producing the desired linear frequency sweep output.

The subtractor 6 acts to provide an error signal $\Delta E_1, \Delta E_2 \ldots \Delta E_6$ representative of the difference in magnitude between the instantaneous drive voltage E and the various reference voltages from the multiplexer 5. The error signal is amplified in a first amplifier 7 having a gain designated for convenience as $G_1$, and coupled to a first sample/hold circuit 8 which acts in response to timing signals from the logic control to sample any difference between the drive voltage E and the appropriate reference voltage at specified times $t_1, t_2 \ldots t_6$ as indicated in FIG. 2.

Thus if an equivalence between the two voltages does not exist at the six sample times, the subtractor 6 will produce six sequential independent error voltages. The voltages are again amplified in an amplifier 9 having a gain designated as $G_2$ and sequentially applied to an array containing six sample/hold circuits including the circuits 10, 11, 12 indicated in FIG. 1. Again, only three of the six assumed sample/hold circuits are illustrated in FIG. 1 in order to simplify this drawing. The individual sample/hold circuits in this array are sequentially actuated by signals from the logic control circuit 30.

It will be noticed that the circuit depicted in FIG. 1 includes two amplifiers 7 and 9 and a preliminary sample/hold circuit 8 as well as the array of six sample/hold circuits. This particular arrangement is preferred as a matter of practicality in that it permits the use of one expensive, high. quality sample/hold circuit 8 and six economical lower quality sample/hold circuits in the array of sample/hold circuits. If desired, the arrangement of FIG. 1 could be simplified by eliminating the preliminary sample/hold circuit 8 and one of the associated amplifiers and upgrading the sample/hold circuits in the array.

Each error signal emergining from the sample/hold circuits 10, 11 or 12 is applied to associated integrators such as integrators 13, 14, or 15, respectively. These integrators act as error accumulators which perform a summation of past errors during previous sweeps.

Thus if a given integrator has accumulated error signals over a period of M frequency sweeps, this accumulated error will be used to correct the M+1 frequency sweep.

The outputs of the various integrators are applied to an output analog multiplexer 16 which acts in accordance with signals from the logic control circuit to produce a set of six sequential correction voltages $Vc_i = Vc_1, Vc_2 \ldots Vc_6$ corresponding to the accumulated error signals in the individual integrators during each frequency sweep. These correction voltages are applied to an adder 17 in the adaptive exponentiator 50 along with a bias voltage $V_N$ from a DC source 18.

The output from the adder 17 is applied through a series resistor $R_3$ to the Y input terminal of a multiplier/divider circuit 19. The multiplier/divider circuit is a known type of device such as a Raytheon RM4200 circuit which includes four terminals designated as X, Y, Z, and O. The X, Y, and Z terminals are virtual grounds or current sinks. The output O represents a current source causing current to flow into the device according to the relationship $$i_0 = B \frac{(i_X i_Y)}{(i_Z)} .$$

The Z terminal is coupled to the source of range voltage $V_R$ through a scaling resistor $R_4$. Since $V_R$ is proportional to the sweep period T (FIG. 2), the current $i_z$ is proportional to T. This in effect divides all correction signals by the seep period T which scales the correction sequence Vci to be close to the actual needed correction sequence for any given period. By doing this the error processor is to a large degree unburdened which makes the sweep frequency linearity better. One might say that the scaling of Vci by the reciprocal of the period T is a compensation or correction, independent of the negative feedback, which reduces the closed loop error.

The current $i_O$ is coupled to an integrator 20 through an analog switch 21 which is controlled by the logic control to remain closed during the sweep interval $T_S$ and open during the retrace interval $T_R$ illustrated in FIG. 2.

An amplifier 22 is coupled into a feedback path around amplifier 20 through a retrace analog switch 23. One input terminal of this amplifier 22, is coupled to ground through a DC voltage reference source $V_S$. During the retrace interval $T_R$, the switch 21 is open and the switch 23 is closed in response to timing signals from the logic control subassembly. This action resets the integrator 20 outut to $V_S$. The output of the integrator 20 is coupled to the VCO through an amplifier 24 having a gain which may be designated as $G_4$. The voltage $V_S$ is chosen so that during the retrace interval the sweep drive voltage will be returned to a suitable level depicted as $G_4 V_S$ in FIG. 2.

The purpose of the Logic Control assembly 30 is to provide all of the timing and switching functions of the Error Processor and the Adaptive Exponentiator.

Figure 3:
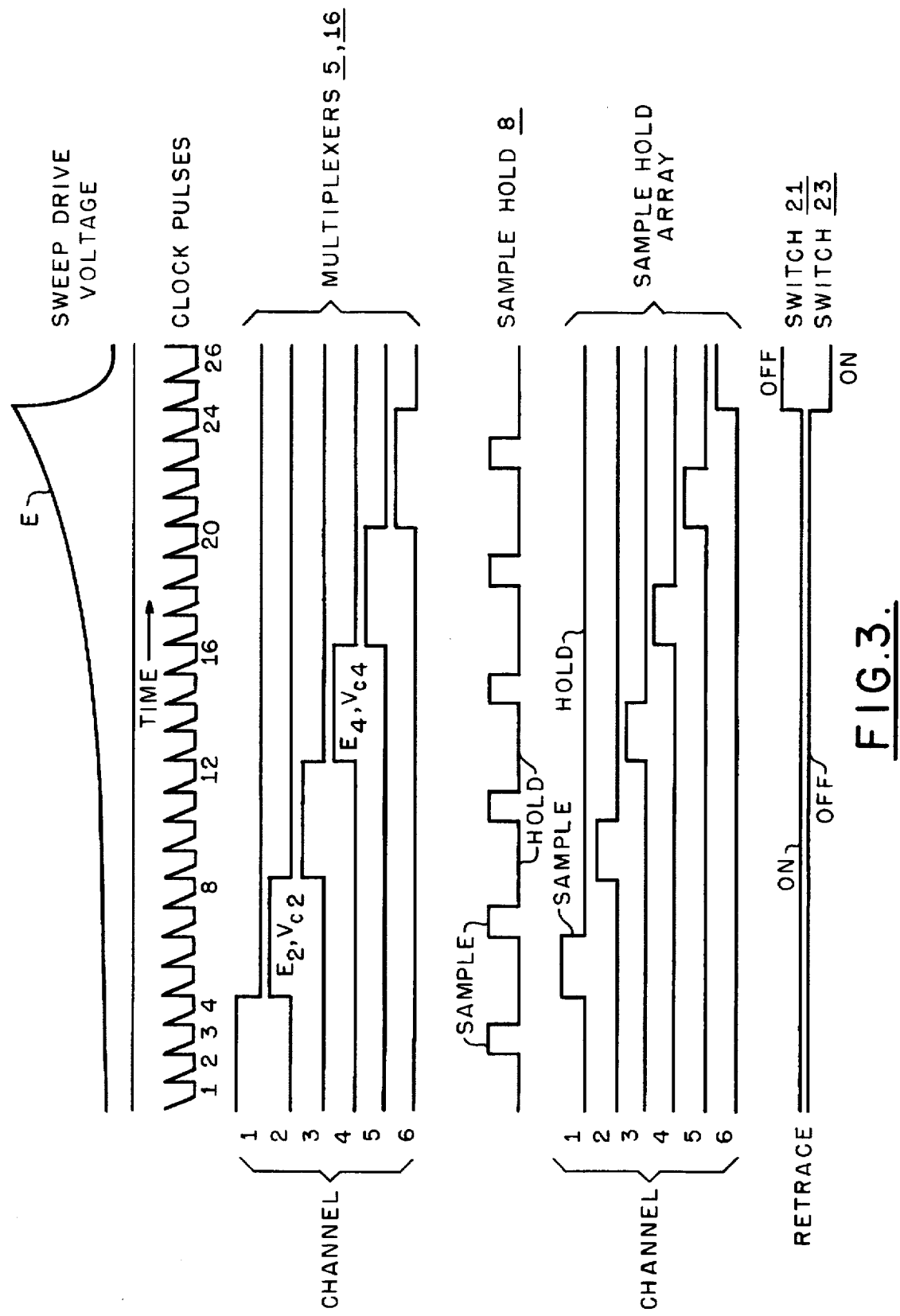
FIG. 3 is a timing diagram useful in explaining the invention.

The necesary timing and switching needed to make the Voltage Feedback Linearizer function is shown in FIG. 3. To produce these switching functions the following approach was used.

Figure 4A:
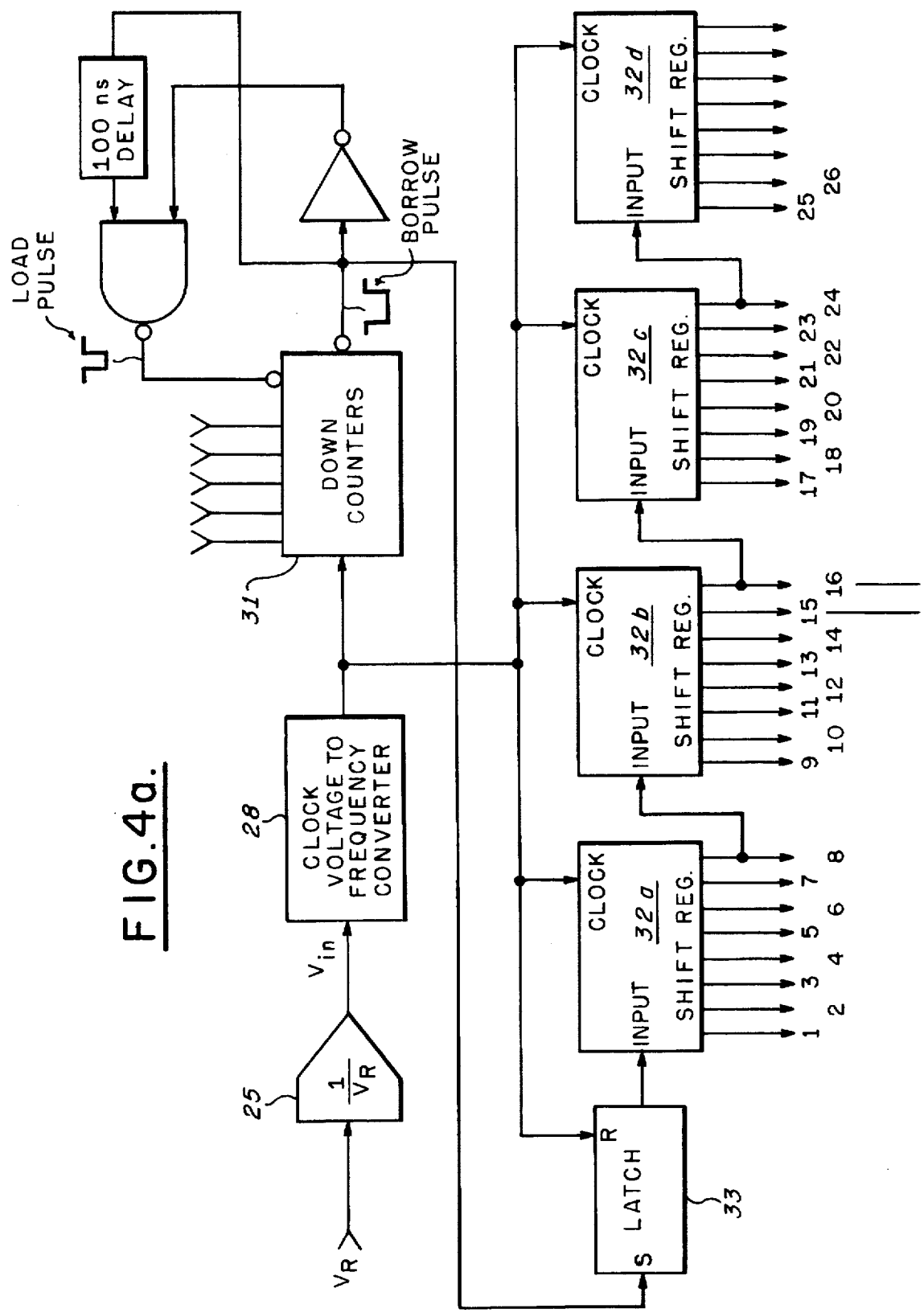
FIG. 4 is a block diagram of the timing generator shown in FIG. 3.
Figure 4B:
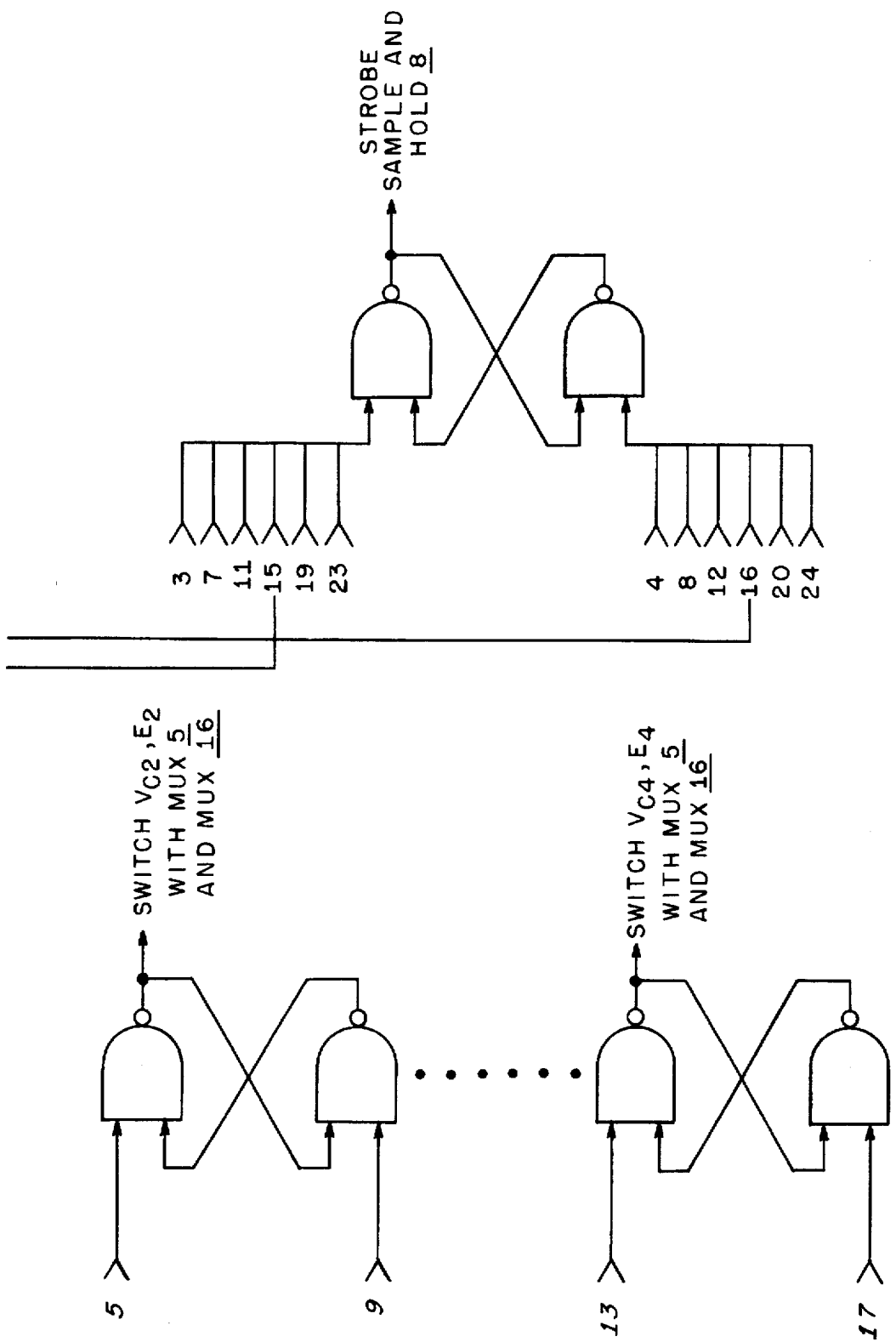

The first requirement is to generate a voltage controlled clock. That is, a clock whose frequency is inversely proportional to range voltage $V_R$. This was accomplished using a divider circuit 25 and a voltage to frequency converter 28. The reader is reminded that range voltage, $V_R$, is proportional to sweep period for an FMCW seeker ranging system. FIGS. 4a and 4b the logic control assembly. The range voltage, $V_R$, is inputted to a divider circuit 25 which takes the reciprocal of the range voltage $V_R$. The divider circuit used in the implemented hardware was the AD534 by Analog Devices. The output of the divider circuit drives a linear voltage to frequency converter 28. The voltage to frequency converter used in the implemented hardware was a 4735 by Teledyne Philbrick. This above circuit arrangement produced the train of clock pulses, shown at the top of FIG. 3, which drives the timing generator 27 of FIG. 1.

Refer now to FIG. 4a, the voltage control clock 28 drives a down counter 31 which is preloaded with a count of 26. When 26 counts have elapsed the down counter outputs a borrow pulse which is used to reload the counter. The down counter 31 used in the implemented hardware is composed of two 74S193 counters. The borrow pulse is a high to low transition and occurs once every 26 clock pulses. The rest of the time the borrow output is high. The borrow pulse is loaded into the serial input of shift register 32 via latch 33. Latch 33 is used only to store the borrow pulse for one clock 28 period since its duration at the output of down counter 31 is only 100 ns. Now serial shift register 32 is driven by the same clock 28 as the counter 31. This means that the logic zero held in latch 33 will be loaded into shift register 32 upon the next clock 28 pulse which is also the start of the next sweep. This logic zero will uniquely appear on each of shift registers 32's parallel outputs starting at output one and sequentially shift from output one to output 26 with each clock 28 pulse. At any given time only one of the 26 shift register 32 outputs is low while the others are high. The 26 bit shift register 32 used in this hardware is composed of four 8 bit 74164 shift registers which are cascaded. The switch functions shown in FIG. 3 are produced with latches attached to the appropriate shift register outputs. As an example, in FIG. 4b to switch $Vc_2$ and $E_2$ using mux(5) and mux(16), a set reset latch connected to shift register outputs 5 and 9 respectively will produce the $Vc_2$, $E_2$ switching as defined in FIG. 3. Similarly, to switch $Vc_4$ and $E_4$ a set reset latch is connected to shift register outputs 13 and 17 respectively. This will provide the necessary switching to activate mux(5) and mux(16) and pass signals $Vc_4$ and $E_4$.

All latches are composed of two input NAND gates with the exception of the latch used to strobe S/H 8. Since this function is needed six times per sweep, two 74S133 NAND gates are connected in the standard way to form a six input set reset latch. This is shown in FIG. 4b. This six input latch when connected to the shift register pins shown in FIG. 4b produces the S/H (8) strobing function, shown in FIG. 3, needed to sample $G_1 \Delta E_i$ at the proper times. FIG. 4b does not show all of the necessary latches to complete the logic control assembly, however, the reader may infer the rest of the circuit based upon the philosophy of operation end the timing diagram FIG. 3.

The timing sequence can be understood by referring to FIG. 3 and FIG. 2. The multiplexers are switched sequentially as indicated in FIG. 3 so as to apply the reference voltages $E_1, E_2, \ldots E_6$ from the multiplexer 5 to the subtractor 6 and the correction voltages $Vc_1, Vc_2, \ldots Vc_6$ from the multiplexer 16 to the adder 17.

The sample-hold element 8 is actuated for a brief sampling interval at times $t_1, t_2, \ldots t_6$ as indicated in FIG. 2.

The six sample-hold circuits in the array are sequentially activated so as to scruple the successive error signals during the time that the respective error signals are being stored in the sample-hold device 8. The error voltages accumulate over successive sweep cycles as has been explained.

The analog switch 21 remains on during the seep interval $T_S$ and off during the retrace interval $T_R$, whereas the opposite switching sequence applies to analog switch 23 as has been explained.

In order to better understand the operation of the invention, refer again to FIG. 1 where it may be shown that:

$$\frac{BG_4}{C_1} \int_0^t \frac{[E/R_2][V_{ci} + V_N]/R_3}{V_R/R_4} \, dt + V_S G_4 = E \quad (1)$$

Where the various parameters are indcated in FIG. 1.

Differentiating E with respect to time yields the following differinal equation:

$$K(V_{ci} + V_N)E = \frac{dE}{dt} \quad (2)$$

where $K = \frac{R_4 G_4 B}{C_1 V_R R_2 R_3}$

The solution of equation (2) is $$E = V_s G_4 \, e^{K \int_{MT}^{t} (V_{ci} + V_N) dt} \quad (3)$$

where $MT < t \leq (M+1)T$.

Referring again to FIG. 2, it can be seen that the six reference voltages are applied in six sequential equal time segments throughout a given sweep interval, $T_S$.

From FIG. 2 it can be seen that the time span for the $i^{TH}$ interval may be expressed as:

i=1 for $MT < t \leq MT + T_s/6$ i=2 for $MT + T_s/6 < t \leq MT + 2\, T_s/6$ i=3 for $MT + 2\, T_s/6 < t \leq MT + 3\, T_s/6$ i=4 for $MT + 3\, T_s/6 < t \leq MT + 4\, T_s/6$ i=5 for $MT + 4\, T_s/6 < t \leq MT + 5\, T_s/6$ i=6 for $MT + 5\, T_s/6 < t \leq MT + T_s$ Applying these restrictions to equation 3 yields:

for E during the $(M+1)^{th}$ sweep where $MT+(i-1)\, T_s/6 < t \leq MT + i\, T_s/6$.

From equation 4 it can be seen that the sweep voltage E during the $(M+1)^{TH}$ sweep is a piecewise continuous function formed by a product sequence of exponentials.

As explained previously, the VCO in the type of equipment being considered possesses a quasi logarithmic tuning characteristic. Therefore the sweep frequency of radar systems using such devices can be linearized by utilizing a quasi exponential drive voltage. In summary, the circuit of the present invention produces an adaptive piecewise continuous set of six exponentials which act to linearize the overall tuning characteristic on a local basis with a set of six independent exponential functions.

It is to be emphasized that although the foregoing discussion is limited to a linearizer employing six mesurement segments, either fewer or more segments may be utilized if desired.

The principles of the invention have been described with respect to a system using a sawtooth sweep. However it is to be understood that the invention maybe readily adapted for use in a system employing a triangular sweep pattern wherein the sweep voltage both rises and falls during a sweep period.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. An apparatus for linearizing a periodic frequency sweep signal generated by a voltage controlled oscillator driven by an oscillator drive voltage comprising:

means for generating a plurality of individual reference voltages;

means coupled to said generating means for sequentially comparing said individual reference voltages with said voltage controlled oscillator drive voltage during each sweep cycle to produce a series of individual error voltages;

means coupled to said comparing means for accumulating individual error voltages during successive sweep cycles;

means coupled to said accumulating means for sequentially sampling said accumulated error voltages to provide sampled accumulated error voltages;

adaptive exponentiator means for converting said sampled accumulated error voltages into a series of exponentially varying drive voltages; and means coupled to said adaptive exponentiator means and said voltage controlled oscillator for driving said voltage controlled oscillator with said exponentially varying drive voltages.

2. Apparatus for linearizing a periodic frequency sweep signal generated by a voltage controlled oscillator responsive to a drive voltage, in a frequency modulated continuous wave radar system of the type in which a range voltage proportional to the sweep period is generated comprising:

means for supplying a plurality of individual reference voltages;

$$E(t) = G_4 V_S \exp[kV_N(t - MT)] \exp\left[ KV_{ci}\left( t - MT - (i-1)\frac{T_S}{6} \right) \right] \prod_{P=1}^{i-1} \exp\left[ KV_{cp} \frac{PT_S}{6} \right] \quad (4)$$

means coupled to receive said oscillator drive voltage and further coupled to said supplying means for sequentially comparing said individual reference voltages with said drive voltage during each sweep cycle so as to produce a series of individual error voltages;

means coupled to said comparing means for accumulating individual error voltages during successive sweep cycles thereby providing accumulated error signals;

means coupled to said accumulating means for sequentially sampling said accumulated error signals;

means coupled to said sampling means for biasing each of said accumulated error signals thereby providing biased accumulated error signals;

multiplier-divider means coupled to said biasing means for sequentially multiplying each of said biased accumulated error signals by a signal representative of said oscillator drive voltage and dividing resultant products by a signal representative of range voltage to obtain quotient signals;

means coupled to said multiplier-divider means for integrating said quotient signals during each sweep interval to obtain integrated signals; and means coupled to said integrating means and said voltage controlled oscillator for for providing drive voltages to said voltage controlled oscillator.

3. A voltage feedback linearizer for use in an FMCW radar system of the type employing a voltage controlled oscillator and producing a range voltage proportional to a sweep cycle including:

logic control means responsive to said range voltage for providing timing signals;

means for providing drive voltages to said voltage controlled oscillator;

means for generating a plurality of individual reference voltages;

means coupled to said drive voltage means and said generating means for sequentially comparing each of said individual reference voltages with magnitudes of said drive voltages in response to timing pulses from said logic control means to produce a series of error voltages;

means coupled to said comparing means for separately accumulating individual error voltages in said series of error voltages during successive sweep cycles to provide accumulated error signals;

means coupled to said accumulating means and said logic control means for sequentially sampling said accumulated error signals during each sweep cycle in response to timing pulses from said logic control means to produce a series of linearity correction voltages;

adaptive exponentiator means responsive to said correction voltages for providing a piecewise continuous voltage formed by a product sequence of exponential voltages; and amplifying means coupled to said voltage controlled oscillator and responsive to said piecewise continuous voltage for providing signals at levels suitable to drive said voltage controlled oscillator.

4. The linearizer of claim 3 wherein said logic control means includes:

dividing means responsive to range voltages produced in said radar system for providing output voltages proportional to reciprocals of said range voltages;

voltage controlled clock means coupled to said dividing means for producing a pulse train having a repetition rate proportional to said output voltages; and timing generator means for providing selected pulses of said pulse train as clock pulses to said comparing means, said accumulating means said sampling means, and said adaptive exponentiator means.

5. The linearizer of claim 4 wherein said timing generator means includes shift register means having a plurality of output stages and responsive to said output voltages, said output voltages propagating from stage to stage for providing said selected pulses.

6. The linearizer of claim 3 wherein each sweep cycle comprises a linear sawtooth wave or a linear triangle wave.

7. A voltage feedback linearizer for use in a FMCW radar system of the type employing a voltage controlled oscillator responsive to drive voltages applied thereto to provide a frequency swept RF output signal proportional to a frequency sweep period of the RF output signal, comprising:

means for providing reference voltages;

error processor means coupled to receive said reference voltages and said drive voltages for supplying sequences of correction voltages utilized to correct said drive voltages;

adaptive exponentiator means coupled to said supplying means for converting said correction voltages into piecewise continuous functions formed by a product sequence of exponentials for each frequency sweep; and logic control means for timing operations of said error processor means and said adaptive exponentiator means.

8. The linearizer of claim 7 wherein the error processor means includes:

means coupled to receive said drive voltages and to said reference voltages means for sequentially comparing reference voltages with said drive voltages during each sweep cycle to derive error voltages;

first sample-hold means coupled to said comparison means for temporarily storing said error voltages;

a multi channel array containing second sample-hold means and an accumulator corresponding to each reference voltage source;

means coupled between said first and second sample-hold means for amplifying signals;

means for sequentially actuating said second sample-hold means during times that corresponding reference voltages are applied to said comparison means, said second sample and hold means coupled to said accumulator means for storing voltages from said second sample-hold means during successive sweep cycles; and multiplexer means coupled to said adaptive exponentiator means and said accumulator means for sequentially coupling accumulators of said accumulator means to said adaptive exponentiator means in synchronism with timing signals of said logic control means means.

* * * * *